United States Patent
Chuang et al.

(10) Patent No.: US 8,390,072 B2
(45) Date of Patent: Mar. 5, 2013

(54) CHEMICAL MECHANICAL POLISHING (CMP) METHOD FOR GATE LAST PROCESS

(75) Inventors: Harry Chuang, Hsinchu (TW); Kong-Beng Thei, Pao-Shan Village (TW); Su-Chen Lai, Hsinchu (TW); Gary Shen, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/156,558

(22) Filed: Jun. 9, 2011

(65) Prior Publication Data

US 2011/0233683 A1   Sep. 29, 2011

Related U.S. Application Data

(62) Division of application No. 12/423,422, filed on Apr. 14, 2009, now Pat. No. 7,981,801.

(60) Provisional application No. 61/096,712, filed on Sep. 12, 2008.

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ............ 257/369; 257/351; 257/357

(58) Field of Classification Search .......... 257/351, 257/357, 900

See application file for complete search history.

(56) References Cited

U.S. PATENT DOCUMENTS

| | | | |
|---|---|---|---|
| 7,056,782 B2 | 6/2006 | Amos et al. | |
| 7,078,282 B2 | 7/2006 | Chau et al. | |
| 7,767,511 B2 | 8/2010 | Visokay | |
| 8,084,824 B2 * | 12/2011 | Yu et al. | 257/369 |
| 2002/0110966 A1 * | 8/2002 | Lee | 438/184 |
| 2005/0269644 A1 | 12/2005 | Brask et al. | |
| 2008/0283932 A1 | 11/2008 | Visokay | |
| 2009/0087974 A1 | 4/2009 | Waite et al. | |
| 2011/0018072 A1 * | 1/2011 | Lin et al. | 257/410 |

FOREIGN PATENT DOCUMENTS

| | | |
|---|---|---|
| CN | 1430264 | 7/2003 |
| CN | 101106131 | 1/2008 |

OTHER PUBLICATIONS

Chinese Patent Office, Office Action dated Oct. 12, 2010, Application No. 200910169147.2, 5 pages.

* cited by examiner

*Primary Examiner* — Thien F Tran
(74) *Attorney, Agent, or Firm* — Haynes and Boone, LLP

(57) ABSTRACT

A method for fabricating a semiconductor device is provided which includes providing a semiconductor substrate, forming a plurality of transistors, each transistor having a dummy gate structure, forming a contact etch stop layer (CESL) over the substrate including the dummy gate structures, forming a first dielectric layer to fill in a portion of each region between adjacent dummy gate structures, forming a chemical mechanical polishing (CMP) stop layer over the CESL and first dielectric layer, forming a second dielectric layer over the CMP stop layer, performing a CMP on the second dielectric layer that substantially stops at the CMP stop layer, and performing an overpolishing to expose the dummy gate structure.

20 Claims, 8 Drawing Sheets

CHEMICAL MECHANICAL POLISHING (CMP) METHOD FOR GATE LAST PROCESS

PRIORITY DATA

This application claims priority to patent application Ser. No. 12/423,422, filed on Apr. 14, 2009, entitled "CHEMICAL MECHANICAL POLISHING (CMP) METHOD FOR GATE LAST PROCESS," which claims priority to Provisional Application Ser. No. 61/096,712 filed on Sep. 12, 2008, entitled "CHEMICAL MECHANICAL POLISHING (CMP) METHOD FOR GATE LAST PROCESS," the entire disclosure of each which is hereby incorporated by reference in its entirety.

BACKGROUND

The present disclosure relates generally to forming an integrated circuit device on a substrate and, more particularly, to a chemical mechanical polishing method for fabricating high-k metal gate devices.

Semiconductor device geometries continue to dramatically decrease in size since such devices were first introduced several decades ago. Today's fabrication plants are routinely producing devices having feature dimensions less than 65 nm. However, solving the problems associated with implementing new process and equipment technology while continuing to satisfy device requirements has become more challenging. For example, metal-oxide semiconductor (MOS) transistors have typically been formed with polysilicon gate electrodes. Polysilicon material has been used due to its thermal resistive properties during high temperature processing, which allows it to be annealed at high temperatures along with source/drain structures.

In some IC designs, there has been a desire to replace the polysilicon gate electrode with a metal gate electrode to improve device performance as feature sizes continue to decrease. A replacement poly gate process (also referred to as a gate last process) may be implemented to address the concerns of high temperature processing on metal materials. In the gate last process, a dummy poly gate is initially formed and the device may continue with processing until deposition of an interlayer dielectric (ILD). The dummy poly gate may then be removed and replaced with a metal gate. However, problems arise when integrating the gate last process with other fabrication processes such as chemical mechanical polishing (CMP) of the ILD layer to expose the dummy poly gate for removal. For example, it may be difficult to control a gate height for devices in various regions of the substrate having different pattern densities.

SUMMARY

One of the broader forms of an embodiment of the present invention involves a method for fabricating a semiconductor device. The method includes providing a semiconductor substrate; forming a plurality of transistors in the semiconductor substrate, each transistor having a dummy gate structure; forming a contact etch stop layer (CESL) over the substrate including the dummy gate structures; forming a first dielectric layer to fill a portion of each region between adjacent dummy gate structures; forming a chemical mechanical polishing (CMP) stop layer over the CESL and first dielectric layer; forming a second dielectric layer over the CMP stop layer; performing a CMP on the second dielectric layer that substantially stops at the CMP stop layer; and performing an overpolishing to expose the dummy gate structures.

Another one of the broader forms of an embodiment of the present invention involves a method for fabricating a semiconductor device. The method includes forming a plurality dummy gate structures over a semiconductor substrate; forming a first stop layer over the semiconductor substrate including the plurality of dummy gate structures, the first stop layer being formed of a first material; forming a first oxide layer to fill a portion of a gap between adjacent dummy gate structures; forming a second stop layer over the first stop layer and first dielectric layer, the second stop layer being formed of a second material; forming a second oxide layer over the second stop layer filling a remainder of the gap; performing a chemical mechanical polishing (CMP) on the second oxide layer that substantially stops at the second stop layer; performing an overpolishing to remove portions of the second stop layer and the first stop layer thereby exposing the dummy gate structures; and removing the dummy gate structures and replacing them with metal gates.

Yet another one of the broader forms of an embodiment of the present invention involves a semiconductor device. The semiconductor device includes a semiconductor substrate and at least two transistors formed in the semiconductor substrate, the at least two transistors each having a metal gate and high-k gate dielectric; and a region between the at least two transistors that includes a first stop layer, a second stop layer, and an oxide layer disposed between the first stop layer and the second stop layer. The first and second stop layers are each formed of a different material than the oxide layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
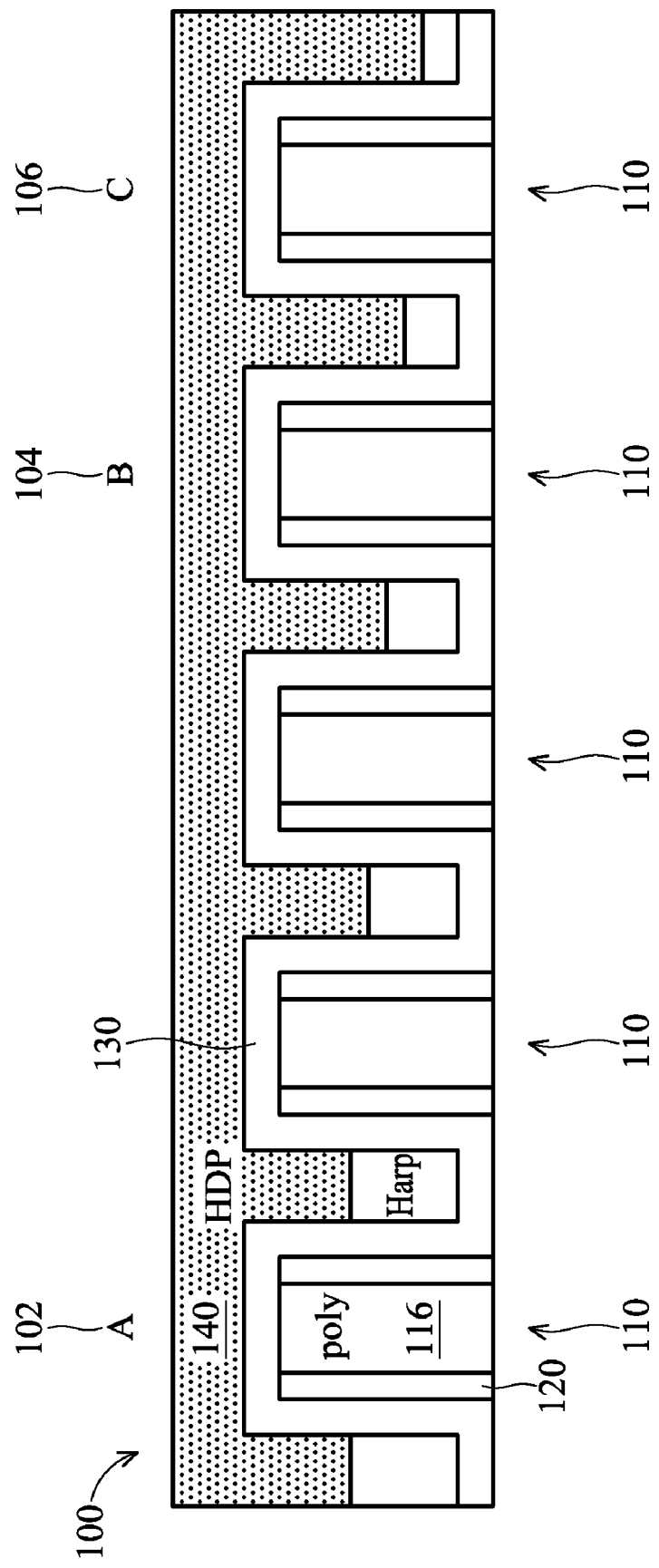
FIGS. 1A to 1C are cross-sectional views of a semiconductor device at various stages of fabrication in a gate last process.

The present disclosure relates generally to forming an integrated circuit device on a substrate and, more particularly, to fabricating a decoupling capacitor as part of an integrated circuit. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however one skilled in the art may recognize applicability to other processes and/or use of other materials.

Figure 1B:
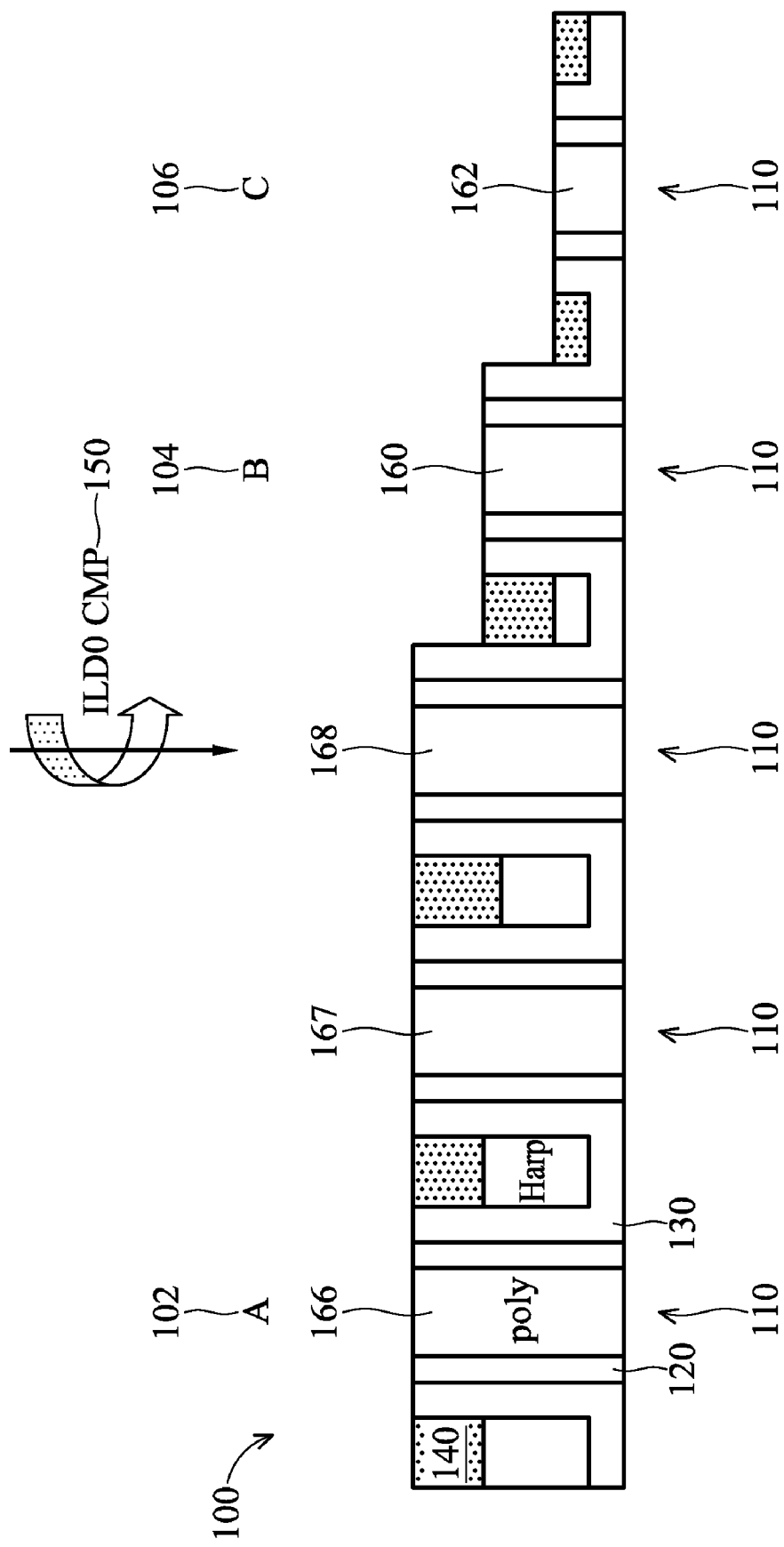
Figure 1C:
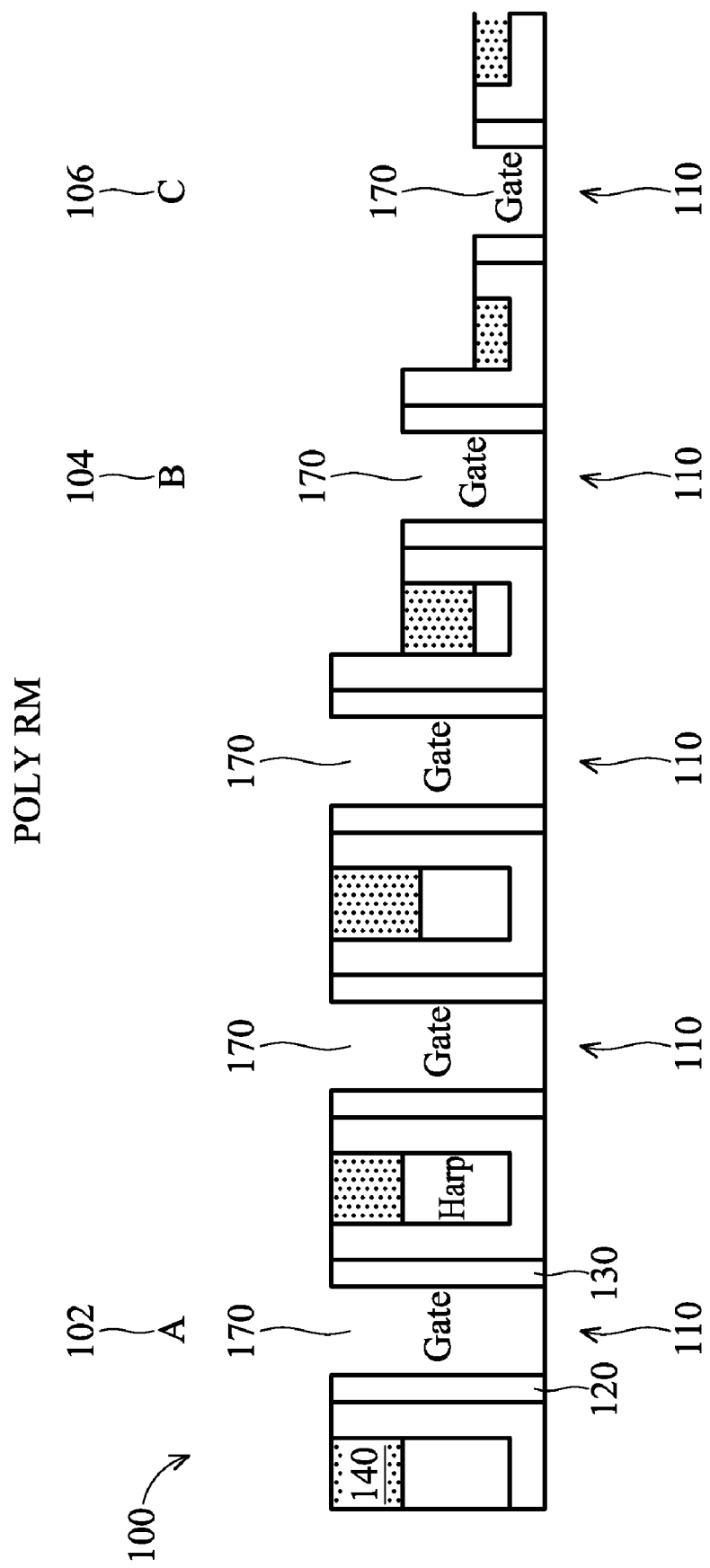

Referring to FIGS. 1A to 1C, illustrated are cross-sectional view of a semiconductor device 100 at various stages of fabrication in a gate last process (also referred to as a replacement poly gate process). It is understood that part of the semiconductor device 100 may be fabricated by complementary metal-oxide-semiconductor (CMOS) technology process flow, and thus some processes are only briefly described herein. Further, the semiconductor device 100 may include various other devices and features such as bipolar junction transistors (BJT), other types of transistors, resistors, capacitors, diodes, fuses, etc. but is simplified for a better understanding of the inventive concepts of the present disclosure.

In FIG. 1A, the semiconductor device 100 may include various regions 102, 104, 106 in which N-channel field effect transistor (nFET) devices or P-channel FET (pFET) devices 110 may be formed. The region 102 may have a higher pattern density of devices as compared to the regions 104 and 106. That is, the region 102 (e.g., dense area) may include more features and/or structures, such as dummy poly gates, that are spaced closely together than the regions 104 and 106. Further, the region 104 may have a higher pattern density of devices than the region 106. Accordingly, the region 106 may be an isolated area having a few devices formed therein and/or devices that are spaced farther apart than in the region 102.

The semiconductor device 100 may include a semiconductor substrate such as a silicon substrate. The substrate may include various doping configurations depending on design requirements as is known in the art. The substrate may also include other elementary semiconductors such as germanium and diamond. Alternatively, the substrate may include a compound semiconductor and/or an alloy semiconductor. Further, the substrate may optionally include an epitaxial layer (epi layer), may be strained for performance enhancement, and may include a silicon-on-insulator (SOI) structure.

The semiconductor device 100 may further include an isolation structure (not shown) such as a shallow trench isolation (STI) feature formed in the substrate for isolating the active regions in the substrate as is known in the art. The isolation structure may be formed of silicon oxide, silicon nitride, silicon oxynitride, fluoride-doped silicate (FSG), and/or a low k dielectric material known in the art.

The nFET and pFET devices 110 may include a gate dielectric layer including an interfacial layer/high-k dielectric layer formed over the substrate. The interfacial layer may include a silicon oxide layer ($SiO_2$) or silicon oxynitride (SiON) having a thickness ranging from about 5 to about 10 angstrom (A) formed on the substrate. The high-k dielectric layer may be formed on the interfacial layer by atomic layer deposition (ALD) or other suitable technique. The high-k dielectric layer may include a thickness ranging from about 5 to about 30 angstrom (A). The high-k dielectric layer may include hafnium oxide ($HfO_2$). Alternatively, the high-k dielectric layer may optionally include other high-k dielectrics such as $TiO_2$, HfZrO, $Ta_2O_3$, $HfSiO_4$, $ZrO_2$, $ZrSiO_2$, combinations thereof, or other suitable material. Further, the high-k gate dielectric layer may include a multiple layer configuration such as $HfO_2/SiO_2$ or $HfO_2/SiON$.

The nFET and pFET devices 110 may further include a capping layer for tuning a work function of a metal layer (for the gate electrode) for properly performing as an nFET or pFET. For example, the capping layer may include $Al_2O_3$, $La_2O_3$, LaSiO, TiAlN, TaN, TaC, TaN, TaSi, TiAl, combinations thereof, or other suitable material. The capping layer may be formed on or underneath the high-k dielectric layer. The capping layer may be formed by ALD, CVD, or PVD.

The nFET and pFET devices 110 may further include a dummy polysilicon (or poly) gate 116 formed on the capping layer by a deposition or other suitable process. The dummy poly gate 116 may include a thickness ranging from 400 to about 800 angstrom (A). The nFET and pFET devices 110 may optionally include a hard mask formed over the dummy poly gate 116. The hard mask may be formed by a deposition process or other suitable process. The hard mask may include silicon nitride, silicon oxynitride, silicon carbide, or other suitable material. Sidewall or gate spacers 120 may be formed on either side of the gate stack as is known in the art. The sidewall spacers 120 may include silicon nitride, silicon oxide, or silicon oxynitride.

The nFET and pFET devices 110 may further include source/drain regions including lightly doped source/drain regions and heavy doped source/drain regions. The source/drain regions may be formed by implanting p-type or n-type dopants or impurities into the substrate depending on the configuration of the devices 110. The dummy poly gates 116 and source/drain structures may be formed by methods including thermal oxidation, polysilicon deposition, photolithography, ion implantation, etching, and various other methods. The nFET and pFET devices 110 may further include silicide features formed on the source/drain regions by a salicide (self-aligned silicide) process to form a contact. The silicide features may include nickel silicide, cobalt silicide, tungsten silicide, tantalum silicide, titanium silicide, platinum silicide, erbium silicide, palladium silicide, or combinations thereof.

After formation of the various microelectronic devices and structures discussed above, a stressed layer may be formed over the substrate. For example, a contact etch stop layer (CESL) 130 may be formed over the nFET and pFET devices 110 in the regions 102, 104, 106. The CESL 130 may be formed of silicon nitride, silicon oxynitride, and/or other suitable materials. The CESL 130 composition may be selected based upon etching selectivity to one or more additional features of the semiconductor device. The CESL 130 may have a thickness ranging from about 150 to about 500 angstrom (A). The CESL 130 may be formed by chemical vapor deposition (CVD) or other suitable process.

A dielectric layer, such as an interlayer dielectric (ILD) 140, may be formed overlying the CESL 130 and filling in the gaps between the devices 110. For example, the gaps between the devices 110 may be partially filled with a silicon oxide using a high-aspect ratio process (HARP). The oxide (HARP) may be porous allowing for better gap fill for high-aspect ratio trenches. Another layer of silicon oxide may then be formed to fill in the remainder of the gaps and over the CESL 130 by high density plasma CVD (HDP-CVD), spin-on, physical vapor deposition (PVD or sputtering), or other suitable methods. In a gate last process, the dummy poly gate structures 116 of the devices 110 may be removed and replaced with metal gate structures as discussed below.

In FIG. 1B, a portion of the ILD layer 140 may be removed and planarized by a chemical mechanical polishing (CMP) process 150 (e.g., ILD0 CMP process) until a top portion of the dummy poly gate structures 116 of the devices 110 is reached or exposed. However, it has been observed that the ILD CMP process 150 may cause some erosion and/or overpolishing at the regions 104, 106 due to the higher pattern structure and density in the other region 102. In other words, the regions 104, 106 having a smaller pattern density (relative to the pattern density of region 102) may experience more polishing than the region 102. The amount of overpolishing may depend on how large the pattern densities differ (relative to one another) in the regions 102, 104, 106. Accordingly, a resultant gate height of the dummy poly gates 160, 162 in the regions 104, 106 may be substantially smaller than the resultant gate height of the dummy poly gates 166-168 in the region 102. Thus, it may be difficult to control the gate height in all the regions 102, 104, 106 of the semiconductor device 100. The variation in the gate heights and subsequent metal gate structures may cause poor device performance and reliability. Further, in some situations the CMP process 150 may cause the dummy poly gates 116 to peel and may cause damage to the active (doped) regions in the substrate which can lead to device failure.

In FIG. 1C, the dummy poly gate structures 160, 162, 166-168 may be removed in the nFET and pFET devices 110 in the regions 102, 104, 106 by an etch back process or other suitable process. For example, the dummy poly gates 160, 162, 166-168, may be selectively etched thereby forming trenches 170 in the gate structure of the devices 110. The dummy poly gates may be removed by a wet etch process that includes exposure to hydroxide containing solution (e.g., ammonium hydroxide), deionized water, and/or other suitable etchant solutions. However, it has been observed that the HARP oxide in the gaps between the devices 110 may have a weak seam damage following the dummy poly removal which can also degrade device performance. The trenches 170 may be subsequently filled with metal materials such as, liners, materials to provide appropriate work function of the gate, gate electrode materials, and/or other suitable materials to form the metal gates for the nFET and pFET devices 110.

Figure 2:
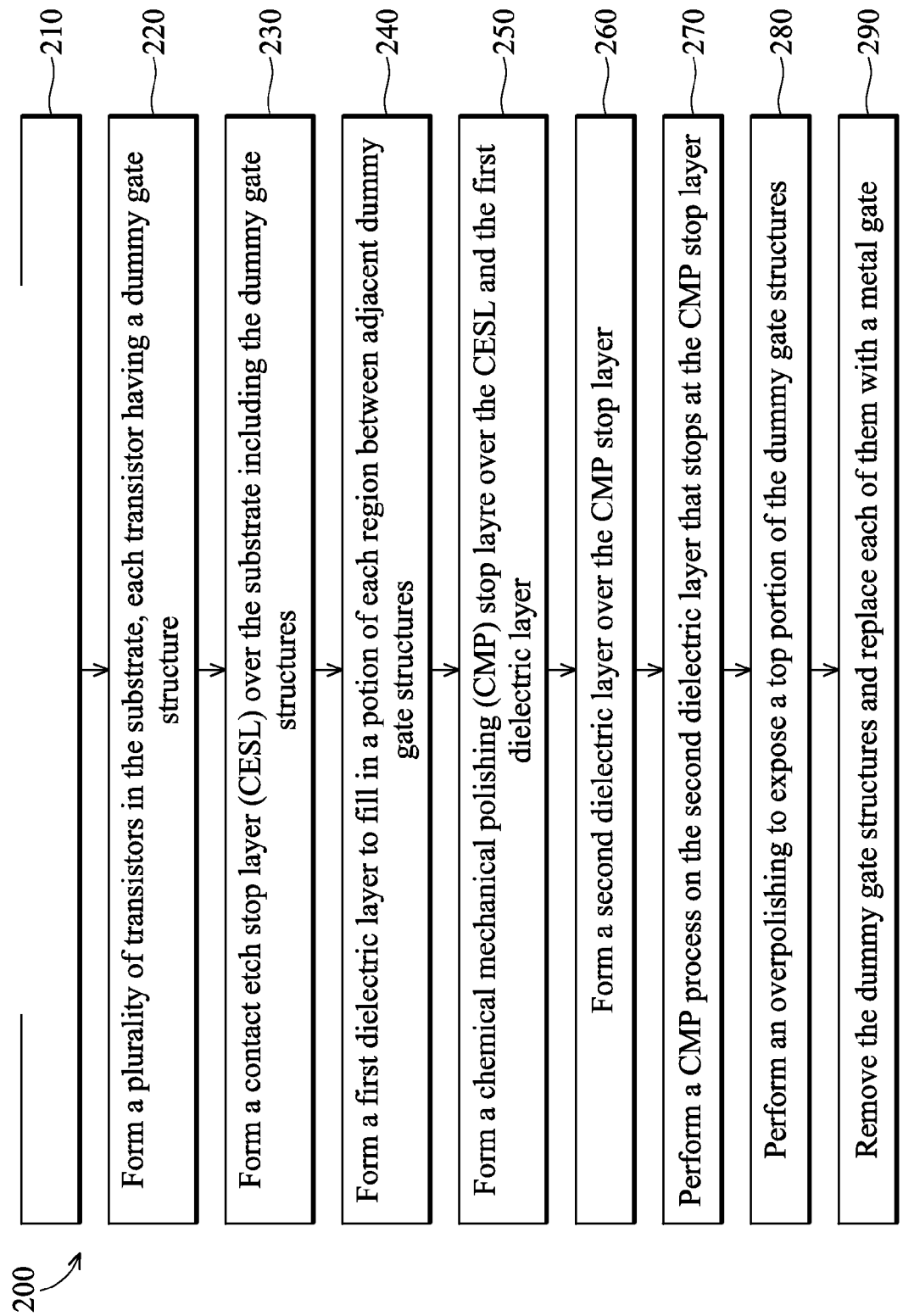
FIG. 2 is a flowchart of a method for fabricating a semiconductor device having a CMP stop layer for a gate last process according to various aspects of the present disclosure.

Referring to FIG. 2, illustrated is a flowchart of a method 200 for fabricating a semiconductor device with a chemical mechanical polishing (CMP) stop layer for a gate last process according to various aspects of the present disclosure. Referring also to FIGS. 3A to 3D, illustrated are cross-sectional views of a semiconductor device 300 being fabricated according to the method 200 of FIG. 2. The semiconductor device 300 is similar to the semiconductor device 100 of FIG. 1 except for the differences discussed below. Accordingly, similar features in FIGS. 1 and 3 are numbered the same for the sake of simplicity and clarity.

It is understood that part of the semiconductor device 300 may be fabricated by a CMOS technology process flow, and thus some processes are only briefly described herein. Further, the semiconductor device 300 may include various other devices and features such as other types of transistors such as bipolar junction transistors, resistors, capacitors, diodes, fuses, etc. but is simplified for a better understanding of the inventive concepts of the present disclosure.

Figure 3A:
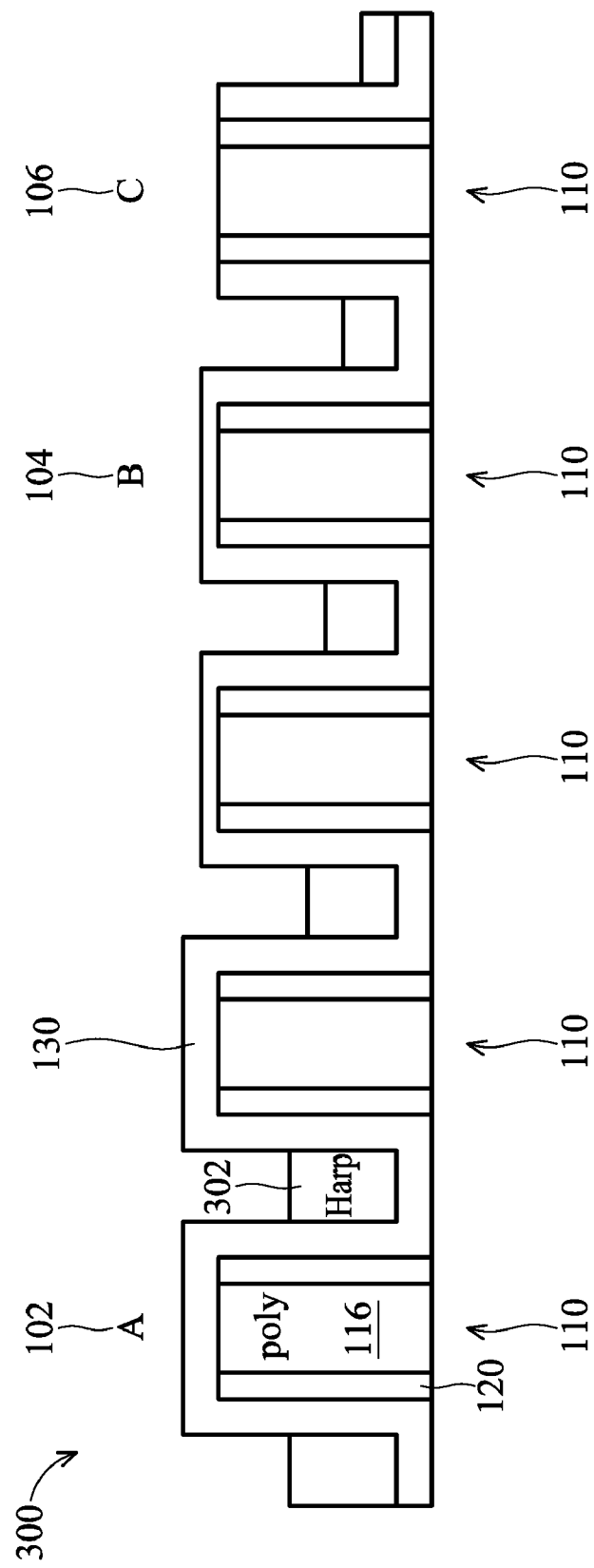
FIGS. 3A to 3D are cross-sectional views of a semiconductor device at various stages of fabrication according to the method of FIG. 2.

The method 200 begins with block 210 in which a semiconductor substrate is provided. In FIG. 3A, the semiconductor device 300 includes a semiconductor substrate such as a silicon substrate. The substrate may include various doping configurations depending on design requirements as is known in the art. The semiconductor device may further include an isolation structure such as a shallow trench isolation (STI) feature formed in the substrate for isolating the active regions in the substrate as is known in the art.

The method 200 continues with block 220 in which a plurality transistors are formed in the substrate, each transistor having a dummy gate structure. The semiconductor device 300 includes various regions 102, 104, 106 in which N-channel field effect transistor (nFET) devices or P-channel FET (pFET) devices 110 may be formed. The region 102 may have a higher pattern density of devices as compared to the regions 104 and 106. That is, the region 102 (e.g., dense area) may include more features and/or structures, such as dummy poly gates, that are spaced closely together than the regions 104 and 106. Further, the region 104 may have a higher pattern density of devices than the region 106. Accordingly, the region 106 may be an isolated area having a few devices formed therein and/or devices that are spaced farther apart than in the region 102.

The nFET and pFET devices 110 include a gate dielectric layer including an interfacial layer/high-k dielectric layer formed over the substrate. The interfacial layer may include a silicon oxide layer ($SiO_2$) or silicon oxynitride (SiON). The high-k dielectric layer may be formed on the interfacial layer by atomic layer deposition (ALD) or other suitable technique. The high-k dielectric layer may include hafnium oxide ($HfO_2$). Alternatively, the high-k dielectric layer may optionally include other high-k dielectrics such as $TiO_2$, HfZrO, $Ta_2O_3$, $HfSiO_4$, $ZrO_2$, $ZrSiO_2$, combinations thereof, or other suitable material. Further, the high-k gate dielectric layer may include a multiple layer configuration such as $HfO_2/SiO_2$ or $HfO_2$/SiON.

The nFET and pFET devices 110 further include a capping layer for tuning a work function of a metal layer (for the gate electrode) for properly performing as an nFET or pFET. For example, the capping layer may include $Al_2O_3$, $La_2O_3$, LaSiO, TiAlN, TaN, TaC, TaN, TaSi, TiAl, combinations thereof, or other suitable material. The capping layer may be formed on or underneath the high-k dielectric layer.

The nFET and pFET devices 110 further include a dummy polysilicon (or poly) gate 116 formed on the capping layer by a deposition or other suitable process. The dummy poly gate 116 may include a thickness ranging from 400 to about 800 angstrom (A). The nFET and pFET devices 110 may optionally include a hard mask formed over the dummy poly gate 116. Sidewall or gate spacers 120 may be formed on either side of the gate stack as is known in the art. The sidewall spacers 120 may include silicon nitride, silicon oxide, or silicon oxynitride.

The nFET and pFET devices 110 further include source/drain regions including lightly doped source/drain regions and heavy doped source/drain regions. The source/drain regions may be formed by implanting p-type or n-type dopants or impurities into the substrate depending on the configuration of the devices 110. The dummy poly gates 116 and source/drain structures may be formed by methods including thermal oxidation, polysilicon deposition, photolithography, ion implantation, etching, and various other methods. The nFET and pFET devices 110 may further include silicide features formed on the source/drain regions by a salicide (self-aligned silicide) process to form a contact.

The method 200 continues with block 230 in which a contact etch stop layer is formed over substrate including the dummy gate structures. After formation of the various microelectronic devices and structures discussed above, a stressed layer may be formed over the substrate. For example, a contact etch stop layer (CESL) 130 is formed over the nFET and pFET devices 110 in the regions 102, 104, 106. The CESL 130 may be formed of silicon nitride, silicon oxynitride, and/or other suitable materials. The CESL 130 composition may be selected based upon etching selectivity to one or more additional features of the semiconductor device. In the present embodiment, the CESL 130 is formed of silicon nitride and may have a thickness ranging from about 150 to about 500 angstrom (A). The CESL 130 may be formed by chemical vapor deposition (CVD) or other suitable process. Further, the CESL 130 may include a tensile-CESL or a compressive-CESL depending on the device configuration.

The method 200 continues with block 240 in which a first dielectric layer is formed to fill a portion of each region between adjacent dummy gate structures. The gaps between the devices 110 may have a high-aspect ratio as the devices 110 are spaced closer to each other. Accordingly, the gaps between the devices 110 may first be partially filled with a silicon oxide 302 using a high-aspect ratio process (HARP). HARP is a deposition process known in the art and thus not described in detail herein. The oxide (HARP) 302 may be porous allowing for better gap fill in the trenches having a high-aspect ratio. For example, the process may include depositing silicon oxide using the HARP, and then performing an etch back process on the silicon oxide 302 from the top surface and may stop at the CESL 130. Thus, the oxide (HARP) 302 may remain in a bottom portion of the gap between the devices 110. It should be noted that some of the HARP oxide 302 may remain on the both sides of the gap as well.

Figure 3B:
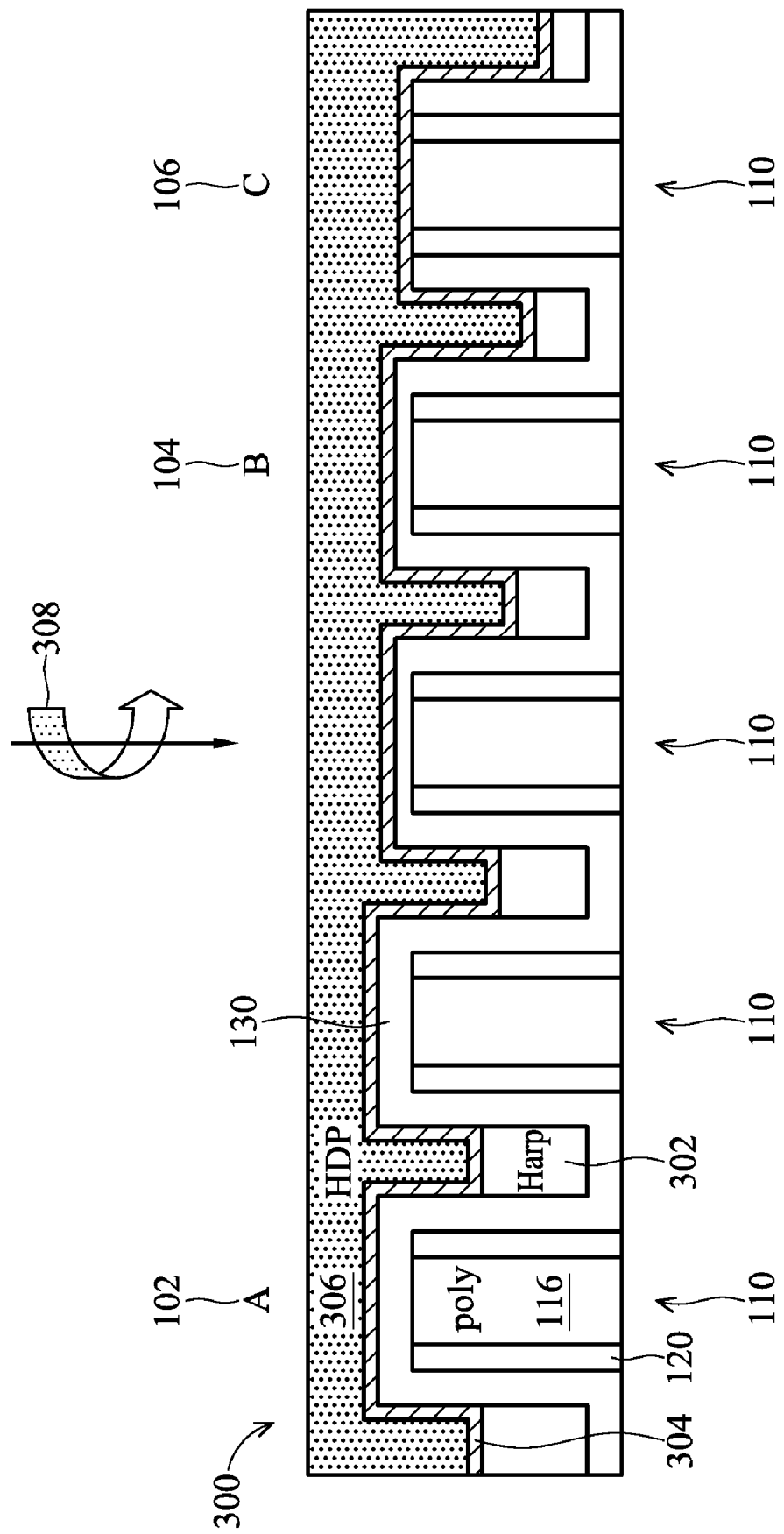

The method 200 continues with block 250 in which a chemical mechanical polishing (CMP) stop layer is formed over the CESL and the first dielectric layer. In FIG. 3B, the CMP stop layer 304 is formed on the CESL 130 and on the oxide (HARP) 302 by a low temperature CVD process or other suitable deposition process. The temperature may range from about 350 to about 500 degree C. In the present embodiment, the CMP stop layer 304 may be formed of silicon nitride and may have a thickness ranging from about 40 to about 80 angstrom (preferably 60 angstrom). In other embodiments, the CMP stop layer 304 may include silicon oxynitride or other suitable materials. The CMP stop layer 304 may improve a process window of the subsequent CMP process as will be discussed below.

The method 200 continues with block 260 in which a second dielectric layer is formed over the CMP stop layer and filling the remainder of each region between the adjacent dummy gate structures. An oxide layer 306 is then formed over the CMP stop layer 304 and may fill in the remainder of the gap between the devices 110. The oxide layer 306 may be formed by high density plasma (HDP) oxide deposition technique, or other suitable methods. The HDP deposition technique is known in the art and thus not described in detail herein. The CMP stop layer 304 within the gaps between the devices 110 provides a better process window for the HDP gap fill of the oxide layer 306 (i.e., less likely to suffer HDP voids before the CMP process). The oxide layer 306 may complete the formation of the interlayer dielectric (ILD) layer.

The method 200 continues with block 270 in which a CMP process is performed on the second dielectric and may stop at the CMP stop layer. The CMP process (e.g., an ILD0 CMP process) 308 is performed on the oxide layer 306 until the CMP stop layer 304 is reached. It should be noted that some of the CMP stop layer 304 may be removed in some regions 104, 106 and not removed in some other regions 102 due to the difference in the dummy poly gate densities of those regions. Further, by stopping at the CMP stop layer 304, the CMP process 308 has a better process window to reduce or avoid unwanted overpolishing of the dummy poly gates 116 in some of the regions 104, 106 of the substrate.

Figure 3C:
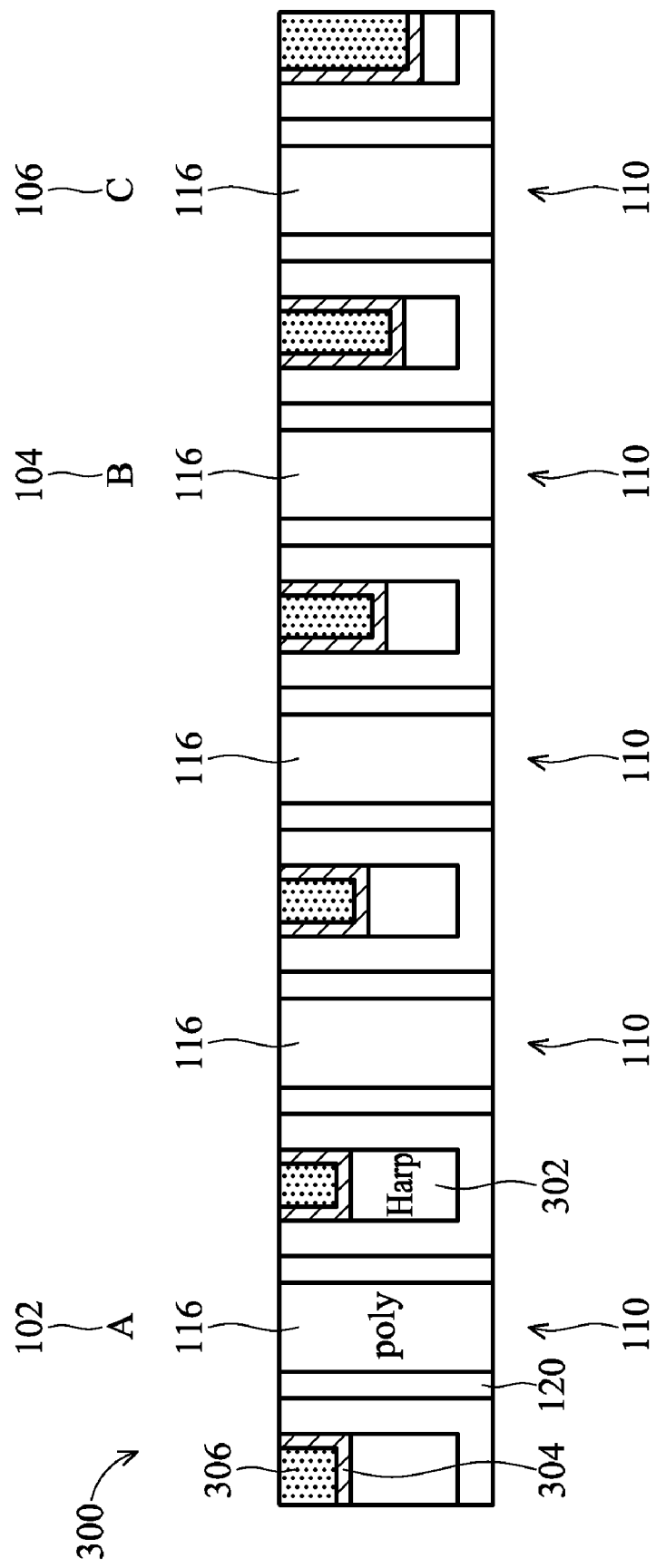
Figure 3D:
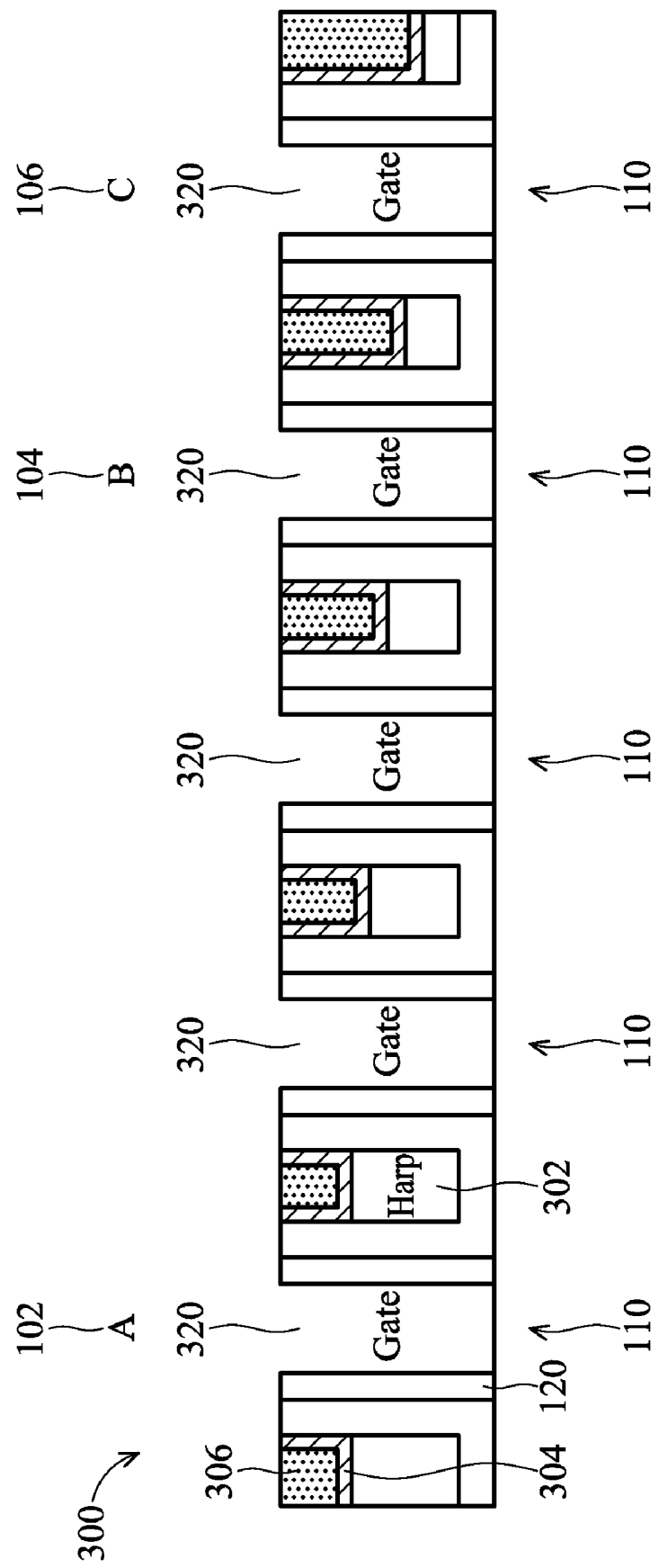

The method 200 continues with block 280 in which an overpolishing is performed to expose the dummy gate structures. In FIG. 3C, the CMP process 308 may continue and overpolish to remove the CMP stop layer 304 and CESL 130 overlying the dummy poly gates 116. The overpolishing may stop when the dummy poly gates 116 are reached or exposed. Accordingly, the gate height of the dummy poly gates 116 may be easier to control with the better process window of the CMP process 308.

The method 200 may continue with block 290 in which the dummy gate structures are removed and replaced with metal gates. For example, in FIG. 3D, the dummy poly gates 116 may be removed in the nFET and pFET devices 110 by an etch back process or other suitable process thereby forming trenches 320 in the gate stacks of the devices 110. For example, the dummy poly gates 116 may be removed by a wet etch process that includes exposure to hydroxide containing solution (e.g., ammonium hydroxide), deionized water, and/or other suitable etchant solutions. The trenches 320 may be subsequently filled with metal materials such as, liners, materials to provide appropriate work function of the gate, gate electrode materials, and/or other suitable materials to form the metal gates for the nFET and pFET devices 110. Thereafter, the semiconductor device 300 may undergo further processing such as forming contacts/vias and an interconnect structure that includes a number of metal layers and inter-metal dielectric as is known in the art.

The present invention achieves different advantages in various embodiments disclosed herein. For example, the present disclosed method provides a simple and cost-effective method and device for improving the process window of the CMP process in a gate last process. Also, the methods and devices disclosed herein may be easily integrated with current CMP process flow and semiconductor processing equipment, and thus are applicable in future and advanced technologies. Further, the methods and devices disclosed herein may help control the gate height of the devices in various regions of the substrate that have different pattern densities. It is understood that different embodiments offer different advantages, and that no particular advantage is necessarily required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor substrate;
   at least two transistors formed in the semiconductor substrate, the at least two transistors each having a metal gate and high-k gate dielectric; and
   a gap between the at least two transistors that includes a first stop layer, a second stop layer, and an oxide layer disposed between the first stop layer and the second stop layer;
   wherein the first and second stop layers are each formed of a different material than the oxide layer, and wherein the second stop layer is free of being in contact with an upper surface of the substrate, and wherein the oxide layer is completely surrounded by the first stop layer and the second stop layer in a cross-sectional view.

2. The semiconductor device of claim 1, wherein the first stop layer includes a contact etch stop layer (CESL) formed of silicon nitride or silicon oxynitride.

3. The semiconductor device of claim 2, wherein the second stop layer includes a CMP stop layer formed of silicon nitride.

4. The semiconductor device of claim 1, wherein the first stop layer has a thickness ranging from about 150 to about 500 angstrom (A), and wherein the second stop layer has a thickness ranging from about 40 to about 80 angstrom (A).

5. The semiconductor device of claim 4, wherein the second stop layer is isolated from the upper surface of the substrate by at least the first stop-layer.

6. The semiconductor device of claim 1, wherein the at least two transistors includes an nFET and a pFET.

7. A semiconductor device, comprising:
a substrate containing a semiconductor material;
a first gate structure and a second gate structure each disposed over the substrate;
a first stop layer disposed between the first and second gate structures, the first stop layer being continuous and defining an opening;
a dielectric layer disposed between the first and second gate structures, the dielectric layer partially filling the opening of the first stop layer; and
a second stop layer disposed between the first and second gate structures, the second stop layer being disposed on the dielectric layer and partially filling the opening of the first stop layer;
wherein an etching selectivity exists between the first stop layer, the second stop layer, and the dielectric layer.

8. The semiconductor device of claim 7, wherein the first stop layer is a contact etch stop layer, the dielectric layer is a silicon oxide layer, and the second stop layer is a chemical-mechanical-polishing stop layer.

9. The semiconductor device of claim 7, wherein portions of the first stop layer are formed on sidewalls of the first gate structure and the second gate structure.

10. The semiconductor device of claim 9, wherein the first and second gate structures each include gate spacers, and wherein the sidewalls of the first and second gate structures are sidewalls of the gate spacers.

11. The semiconductor device of claim 7, wherein the first stop layer and the second stop layer each have a trench-like profile.

12. The semiconductor device of claim 7, further including an oxide material disposed between the first and second gate structures, the oxide material being disposed on a portion of the second stop layer.

13. The semiconductor device of claim 7, wherein the dielectric layer is porous.

14. The semiconductor device of claim 7, wherein the first and second gate structures each include a metal gate electrode and a high-k gate dielectric.

15. The semiconductor device of claim 7, wherein the first stop layer has a thickness that is in a range from about 150 Angstroms to about 500 Angstroms, and wherein the second stop layer has a thickness that is in a range from about 40 Angstroms to about 80 Angstroms.

16. A semiconductor device, comprising:
a semiconductor substrate;
a gate formed over the substrate, the gate including a metal gate electrode and a high-k gate dielectric;
a contact etch stop layer formed over the substrate and adjacent to the gate, the contact etch stop layer forming a first trench;
a dielectric component located on a portion of the contact etch stop layer and partially filling the first trench; and
a chemical-mechanical-polishing (CMP) stop layer formed within the first trench, the CMP stop layer being continuous and forming a second trench over the dielectric component, wherein the CMP stop layer is isolated from the substrate by at least a portion of the contact etch stop layer.

17. The semiconductor device of claim 16, further including an oxide component filling the second trench.

18. The semiconductor device of claim 16, wherein the contact etch stop layer, the CMP stop layer, and the dielectric component each include a different material.

19. The semiconductor device of claim 16, wherein the gate is a first gate, and further including a second gate formed over the substrate, wherein the contact etch stop layer, the dielectric component, and the CMP stop layer are located between the first and second gates.

20. The semiconductor device of claim 16, wherein the contact etch stop layer has a thickness that is in a range from about 150 Angstroms to about 500 Angstroms, and wherein the CMP stop layer has a thickness that is in a range from about 40 Angstroms to about 80 Angstroms.

* * * * *